(12) United States Patent
Koike et al.

(10) Patent No.: US 8,258,626 B2
(45) Date of Patent: Sep. 4, 2012

(54) COPPER INTERCONNECTION, METHOD FOR FORMING COPPER INTERCONNECTION STRUCTURE, AND SEMICONDUCTOR DEVICE

(75) Inventors: Junichi Koike, Sendai (JP); Akihiro Shibatomi, Sendai (JP)

(73) Assignee: Advanced Interconnect Materials, LLC, Miyagi (JP)

( * ) Notice: Subject to any disclaimer, the term of this patent is extended or adjusted under 35 U.S.C. 154(b) by 304 days.

(21) Appl. No.: 12/586,043

(22) Filed: Sep. 15, 2009

(65) Prior Publication Data

US 2010/0065967 A1    Mar. 18, 2010

(30) Foreign Application Priority Data

Sep. 16, 2008 (JP) .................................. 2008-236211

(51) Int. Cl.
*H01L 23/48* (2006.01)
*H01L 29/40* (2006.01)
*H01L 23/52* (2006.01)

(52) U.S. Cl. ........ 257/751; 257/762; 257/760; 257/774; 257/E21.171; 257/E21.376; 257/E21.593; 257/E21.021; 257/E21.584; 438/627; 438/637; 438/653; 438/674

(58) Field of Classification Search .................. 257/762, 257/E21.495, E23.141, 751, 760, 774, E21.171, 257/E21.376, E21.021, E21.584; 438/627, 438/637, 653, 674

See application file for complete search history.

(56) References Cited

U.S. PATENT DOCUMENTS

| 7,507,666 B2 | 3/2009 | Nakao et al. |
| 7,612,452 B2 * | 11/2009 | Ohba et al. ..................... 257/751 |
| 7,755,192 B2 * | 7/2010 | Koike et al. .................... 257/751 |
| 8,112,885 B2 * | 2/2012 | Koike et al. ..................... 29/852 |
| 2005/0218519 A1 * | 10/2005 | Koike et al. .................... 257/756 |

FOREIGN PATENT DOCUMENTS

| JP | H01-202841 | 8/1989 |
| JP | H11-186273 | 7/1999 |
| JP | 2000-068269 | 3/2000 |
| JP | 2001-044156 | 2/2001 |
| JP | 2004-266178 | 9/2004 |

(Continued)

OTHER PUBLICATIONS

S.M. Sze, Semiconductor Devices—Physics and Technology 2nd Edition, Mar. 2004, p. 346-347, 355-356, Sangyo Tosho.

(Continued)

*Primary Examiner* — Zandra Smith
*Assistant Examiner* — Tsz Chiu
(74) *Attorney, Agent, or Firm* — Sughrue Mion, PLLC

(57) ABSTRACT

A copper interconnection structure includes an insulating layer, an interconnection body including copper and a barrier layer surrounding the interconnection body. The barrier layer includes a first barrier layer formed between a first portion of the interconnection body and the insulating layer. The first portion of the interconnection body is part of the interconnection body that faces the insulating layer. The barrier layer also includes a second barrier layer formed on a second portion of the interconnection body. The second portion of the interconnection body is part of the interconnection body not facing the insulating layer. Each of the first and the second barrier layers is formed of an oxide layer including manganese, and each of the first and the second barrier layers has a position where the atomic concentration of manganese is maximized in their thickness direction of the first and the second barrier layers.

5 Claims, 6 Drawing Sheets

FOREIGN PATENT DOCUMENTS

| | | |
|---|---|---|
| JP | 2005-277390 | 10/2005 |
| JP | 2007-096241 | 4/2007 |
| JP | 2008-124275 A | 5/2008 |
| JP | 2008-147467 A | 6/2008 |
| JP | 2008-153472 A | 7/2008 |
| JP | 2008-170744 A | 7/2008 |
| WO | WO2006/025347 A1 | 3/2006 |
| WO | WO2007/100125 A1 | 9/2007 |

OTHER PUBLICATIONS

Notice of Reasons for Rejection issued in Japanese Application No. 2008-236211, Dispatch date: Aug. 4, 2009, Examiner Ken Haseyama, Japanese Patent Office.

* cited by examiner

Distance from second barrier layer surface (depth)

COPPER INTERCONNECTION, METHOD FOR FORMING COPPER INTERCONNECTION STRUCTURE, AND SEMICONDUCTOR DEVICE

This application claims priority under 35 U.S.C. §119 from Japanese patent application Serial No. 2008-236211, filed Sep. 16, 2008, entitled "Copper interconnection structure, semiconductor device and method for forming copper interconnection structure", which is incorporated herein by reference in its entirety.

TECHNICAL FIELD

The present invention relates to a copper interconnection provided with an interconnection body made of copper on an electric insulating layer, a method for forming the copper interconnection, and a semiconductor device provided with the copper interconnection as a circuit interconnection.

BACKGROUND OF THE INVENTION

Copper (Cu) has a lower resistivity (1.7 $\mu\Omega\cdot$cm) compared to aluminum (Al) with a resistivity of 2.7 $\mu\Omega\cdot$cm. Additionally, copper has a higher resistance against electro-migration and stress-migration and has been used as a material for manufacturing an interconnection body in semiconductor devices. Examples of semiconductor devices may include silicon semiconductor devices including large scale integrated (LSI) systems, flash memory devices or the like, or large size liquid crystal display devices (LCD) (for example, refer to patent documents 1 to 3).

[Patent Document 1]: Japanese Unexamined Patent Application Publication No. 2005-277390

[Patent Document 2]: International Publication No. WO2006/025347A1

[Patent Document 3]: International Publication No. WO2007/100125A1

For example, in a silicon LSI system used as a central processing unit (CPU), copper interconnection with damascene structure are used as an interconnection body. In this structure, copper which composes the interconnection body, is formed so as to fill the inside of trenches or via holes provided on an insulating layer made from silicon dioxide ($SiO_2$) or the like (refer to non-patent document 1).

[Non-Patent Document 1] "Semiconductor Device ($2^{nd}$ edition)—Physics and Technology" by S. M. Sze (ISBN4-7828-5550-8 C3055), Oct. 5, 2005, Sangyo Tosho, Co., Ltd., third impression of second edition, P355-356.

In order to prevent the degradation of insulating properties of the insulating layer, due to the atomic diffusion of copper forming the interconnection body into the insulating layer, or on the other hand, to prevent an increase in the electric resistance of the copper interconnection body, due to the atomic diffusion of atoms composing the insulating layer, such as silicon (Si) into the interconnection body, it is common to configure a copper interconnection structure including a barrier layer formed between the insulating layer and the copper interconnection body. This barrier layer may prevent the mutual diffusion of atoms while forming the copper interconnection structure (for example, refer to patent documents 4 to 6).

[Patent Document 4] Japanese Unexamined Patent Application Publication No. H01-202841

[Patent Document 5] Japanese Unexamined Patent Application Publication No. H11-186273

[Patent Document 6] Japanese Unexamined Patent Application Publication No. 2001-44156

Conventionally, the barrier layer of the copper interconnection structure is made from tungsten nitride (WN) (for example, refer to patent document 7), tantalum (Ta) (for example, refer to patent document 8), rhenium (Re) (for example, refer to patent document 9) and the like.

[Patent Publication 7] Japanese Unexamined Patent Application Publication No. 2000-068269

[Patent Document 8] Japanese Unexamined Patent Application Publication No. 2004-266178

[Patent Document 6] Japanese Unexamined Patent Application Publication No. 2007-096241

In recent years, in view of the necessity for decreasing the interconnection width (32 nm or less) to increase the LSI integration density, a technique has been disclosed to form a thin barrier layer. The thin barrier layer is formed from a self forming manganese oxide layer or the like using a copper layer containing an additional element such as manganese (Mn). The additional element of the copper layer has a diffusion coefficient greater than the self diffusion coefficient of copper (refer to patent publications 1 to 3 above).

In order to form a barrier layer using a copper layer containing manganese (Mn), it is common to first deposit a copper alloy layer so as to cover an inner surface of a trench opening provided on an insulating layer. Examples of the insulating layer may include porous silicon dioxide ($SiO_2$), silicon carbide oxide (SiOC) or the like. Second, it is common to bury copper, which forms the interconnection body, into a remaining space of the trench opening or via hole, and then heat treating the copper alloy layer and the copper interconnection body in an atmosphere containing oxygen molecules.

By this heat treatment, a barrier layer containing silicon (Si), oxygen (O), and manganese (Mn) is formed between the insulating layer and the copper interconnection body (for example, refer to patent documents 1 and 2 above). Alternatively, a barrier layer containing silicon (Si), oxygen (O), manganese (Mn), and copper (Cu) may be formed (refer to patent document 3 above). It is also known that an additional barrier layer may also be formed in close proximity to a so-called open surface area, such as an upper surface of the copper interconnection body, where the additional barrier layer is not facing the insulating layer. The additional barrier layer is formed by a reaction with the atmosphere containing oxygen molecules when the heat treatment is applied (for example, refer to patent documents 1 to 3 above).

In the barrier layer, formed between the copper interconnection body and the insulating layer, some requirements, such as an atomic concentration of manganese distribution, has been already known to provide a barrier layer with sufficient barrier properties (refer to patent document 3 above). Meanwhile, it is still unclear what type of internal configuration may exercise effective barrier functions for the barrier layer formed the open surface of the copper interconnection body. In addition, it is further unclear what types of process may be used to form a stable barrier layer, on the open surface of the copper interconnection body, with effective barrier properties.

The present invention is made under the above-mentioned situation. The purpose of the present invention is to provide a copper interconnection structure having an effective barrier function in the barrier layer on the open surface of the copper interconnection body by providing an appropriate internal structure in the barrier layer. Further, the purpose of the present invention is to provide a method for forming the copper interconnection structure including the barrier layer having such an effective barrier function. Further, the purpose of the present invention is to provide a semiconductor device having the copper interconnection structure as a circuit interconnection.

SUMMARY OF THE INVENTION

In accordance with a first aspect of the present invention, a copper interconnection structure includes:
an insulating layer;
an interconnection body including copper; and
a barrier layer surrounding the interconnection body, wherein the barrier layer includes:
- a first barrier layer formed between a first portion of the interconnection body and the insulating layer, wherein the first portion of the interconnection body is a part of the interconnection body that faces the insulating layer, and
  - a second barrier layer formed on a second portion of the interconnection body, wherein the second portion of the interconnection body is a part of the interconnection body not facing the insulating layer, and wherein:
- each of the first and the second barrier layers is formed of an oxide layer including manganese, and
- each of the first and the second barrier layers has a position where the atomic concentration of manganese is maximized in their thickness direction of the first and the second barrier layers.

In the first aspect of the present invention described above, each of the first and second barrier layers is formed of an oxide layer including manganese (Mn). Further, each of the first and the second barrier layers has a position where the atomic concentration of manganese is maximized in their thickness direction of the first and the second barrier layers. Therefore, in each of the first and the second barrier layers, manganese is surely converted into an oxide layer with electrical insulating properties. In this way, the barrier layers prevent the atomic diffusion of copper, from the interconnection body into the insulating layer. In addition, the atomic diffusion of atoms composing the insulating layer, e.g. silicon (Si), into the interconnection body can surely be prevented. Therefore, it is possible to produce an interconnection body featuring a barrier layer with a higher barrier property, against the atomic diffusion, and also superior in electrical insulating properties. In addition, it is also possible to provide a copper interconnection structure featuring an interconnection body with a lower electrical resistivity and higher conductivity.

In accordance with a second aspect of the present invention, a method for forming a copper interconnection structure includes the steps of:
forming an opening in an insulating layer, wherein the opening comprises an inner surface side facing the insulating layer;
forming a copper alloy layer including manganese having an atomic concentration of not less than 1.0 atom % and not more than 25 atom % on the inner surface side;
forming a buried copper over the copper alloy layer so as to substantially filling the opening; and
applying a heat treatment under a predetermined condition after the burying step, wherein the predetermined condition includes:
- a temperature of not less than 150° C. and not more than 450° C., and
- oxygen partial pressure being adjusted to be less than an atomic concentration of oxygen ($N_o$) in the copper alloy layer according to:

$$N_o = N_{Mn} * D_o / D_{Mn},$$

wherein:
- $N_{Mn}$: atomic concentration of Manganese contained in the copper alloy layer,
- $D_o$: diffusion coefficient of oxygen atom in the copper alloy layer, and
- $D_{Mn}$: diffusion coefficient of manganese in the copper alloy layer.

In the second aspect of the present invention described above, the heat treatment is applied under the predetermined condition. Due to this heat treatment, a barrier layer is formed so as to surround an interconnection body. The barrier layer is formed of an oxide layer including manganese. The barrier layer has a position where the atomic concentration of manganese is maximized in their thickness direction of the barrier layer. Accordingly, it is possible to manufacture a copper interconnection structure featuring an interconnection body with a low electrical resistivity and superior conductivity.

In accordance with a third aspect of the present invention, a method for forming a copper interconnection structure includes the steps of:
forming a copper alloy layer including manganese having an atomic concentration of not less than 1.0 atom % and not more than 25 atom % over a main body with insulating properties;
forming an insulating layer over the copper alloy layer;
removing parts of the copper alloy layer and the insulating layer such that an insulating portion stacked on a copper alloy portion is formed over the main body, wherein the copper alloy portion includes:
- a top surface side facing the insulating portion,
- a bottom surface side facing the main body, and
- two open surface sides exposed to a surrounding atmosphere; and applying a heat treatment under a predetermined condition after the removing step, wherein the predetermined condition includes:
- a temperature of not less than 150° C. and not more than 450° C., and
- oxygen partial pressure being adjusted to be less than an atomic concentration of oxygen ($N_o$) in the copper alloy layer according to:

$$N_o = N_{Mn} * D_o / D_{Mn},$$

wherein:
- $N_{Mn}$: atomic concentration of Manganese contained in the copper alloy layer,
- $D_o$: diffusion coefficient of oxygen atom in the copper alloy layer, and
- $D_{Mn}$: diffusion coefficient of manganese in the copper alloy layer.

In the third aspect of the present invention described above, the heat treatment is applied under the predetermined condition. Due to this heat treatment, a barrier layer is formed on a top surface side and on two open surface sides of an interconnection body. The barrier layer is formed of an oxide layer including manganese. The barrier layer has a position where the atomic concentration of manganese is maximized in their thickness direction of the barrier layer. This means that such a barrier layer may be formed even in a manufacturing method where interconnection patterns are formed by photolithography process. Accordingly, it is possible to manufacture a copper interconnection structure providing an interconnection body with a low electrical resistivity and higher conductivity.

Further areas of applicability of the present disclosure will become apparent from the detailed description provided hereinafter. It should be understood that the detailed description and specific examples, while indicating various embodiments, are intended for the purposes of illustration only and are not intended to necessarily limit the scope of the disclosure.

DETAILED DESCRIPTION OF THE INVENTION

Embodiments of the present invention will be described hereinafter with reference to the accompanying drawings, in which preferred exemplary embodiments of the invention are shown. The ensuing description is not intended to limit the scope, applicability or configuration of the disclosure. Rather, the ensuing description of the preferred exemplary embodiments will provide those skilled in the art with an enabling description for implementing preferred exemplary embodiments of the disclosure. It should be noted that this invention may be embodied in different forms without departing from the spirit and scope of the invention as set forth in the appended claims.

Figure 1:
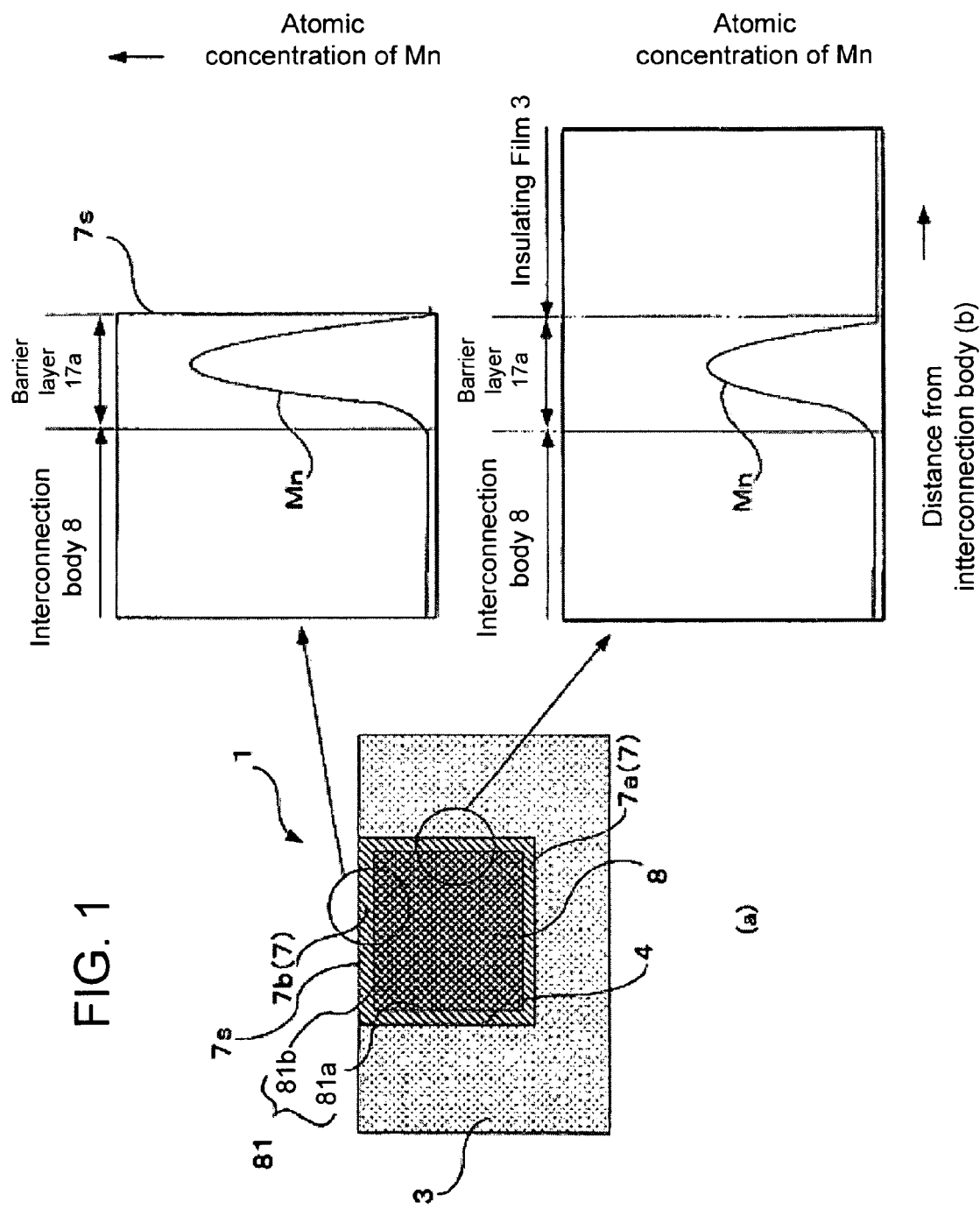
FIG. 1 illustrates a cross-sectional view of an embodiment of a copper interconnection structure and a compositional view of its barrier layers.

Embodiments of the present invention relates in general to copper interconnections and their manufacturing process. It is specifically relates to a new generation of copper interconnections with an interconnection body made of copper, surrounded by a barrier layer on an electric insulating layer Referring first to FIG. 1, an embodiment of a copper interconnection structure 1 with a compositional view of its barrier layer 7 is shown. A cross-sectional view of the copper interconnection structure 1 and an atomic concentration of manganese in the barrier layer 7 are shown, respectively, in FIGS. 1(a) and 1(b). The copper interconnection structure 1 may include an interconnection body 8, a barrier layer 7 and an electric insulating layer 3. The interconnection body 8 is made of copper and its outer surface 81 is surrounded by the barrier layer 7. The barrier layer 7 is made of two portions: (1) a first barrier layer 7a and 2) a second barrier layer 7b. Accordingly, the outer surface 81 of the interconnection body 8 is also made of two portions: (1) a first outer surface 81a and 2) a second outer surface 81b. Thus, the first barrier layer 7a is formed between the electric insulating layer 3 and the first outer surface 81a, where the first outer surface 81a is part of the interconnection body 8 that faces the electric insulating layer 3. Further, the second barrier layer 7b is formed on the second outer surface 81b, where the second outer surface 81b is part of the interconnection body 8, which is not facing the electric insulating layer 3.

In this embodiment, each of the first and second barrier layers 7a and 7b is formed from an oxide layer containing manganese (Mn). Further, as shown in FIG. 1(b), each of the barrier layers 7a and 7b has a position where an atomic concentration of Mn is maximized in a thickness direction of the barrier layers 7a and 7b.

Therefore, in each of the first and second barrier layers 7a and 7b, manganese is surely converted into an oxide layer with electrical insulation properties. In this way, the barrier layer 7 may prevent the atomic diffusion of copper, from the interconnection body 8 into the insulating layer 3. In addition, the atomic diffusion of atoms composing the insulating layer 3, e.g. silicon (Si), into the interconnection body 8 can surely be prevented. Therefore, it is possible to manufacture an interconnection body featuring a barrier layer with a higher barrier property, against the atomic diffusion, and also superior in electrical insulating properties. In addition, it is also possible to provide a copper interconnection structure featuring an interconnection body with a lower electrical resistivity and higher conductivity.

Further, in this embodiment, an atomic concentration of oxygen in the second barrier layer 7b is maximized in close proximity to the position where the atomic concentration of manganese is maximized. In addition, the maximum atomic concentration of manganese in the second barrier layer 7b is greater than the atomic concentration of manganese in the first barrier layer 7a. As it will be discussed further below in detail, the second barrier layer 7b is formed on the upper surface of the interconnection body 8, which exposes to the atmosphere containing oxygen at the time the barrier layer 7 is formed. Thereby, it becomes possible to surely prevent the oxygen in the atmosphere from intruding into the interconnection body 8 by configuring the second barrier layer 7b as described above. Therefore, further improvement may be achieved by providing the interconnection body 8 with lower resistivity and superior conductivity.

According to embodiments of the present invention, manganese in the second barrier layer 7b is symmetrically disturbed centering the position where the atomic concentration of the manganese is maximized in the thickness direction. In addition, oxygen in the second barrier layer 7b is also symmetrically distributed centering the position where the atomic concentration of oxygen is maximized in the thickness direction. Therefore, it is equally possible to prevent impurities from intruding into the interconnection body 8 from the surface 7s of the second barrier layer 7b. Additionally, it is also possible to prevent the bidirectional movement of copper from the interconnection body 8 into the surface 7s of the second barrier layer 7b due to the self diffusion of copper. Thereby, it is possible to obtain a barrier layer with superior barrier properties. In this way, it is possible to further surely provide a copper interconnection structure 1 with an interconnection body 8 featuring a lower resistivity and higher conductivity.

Figure 2:
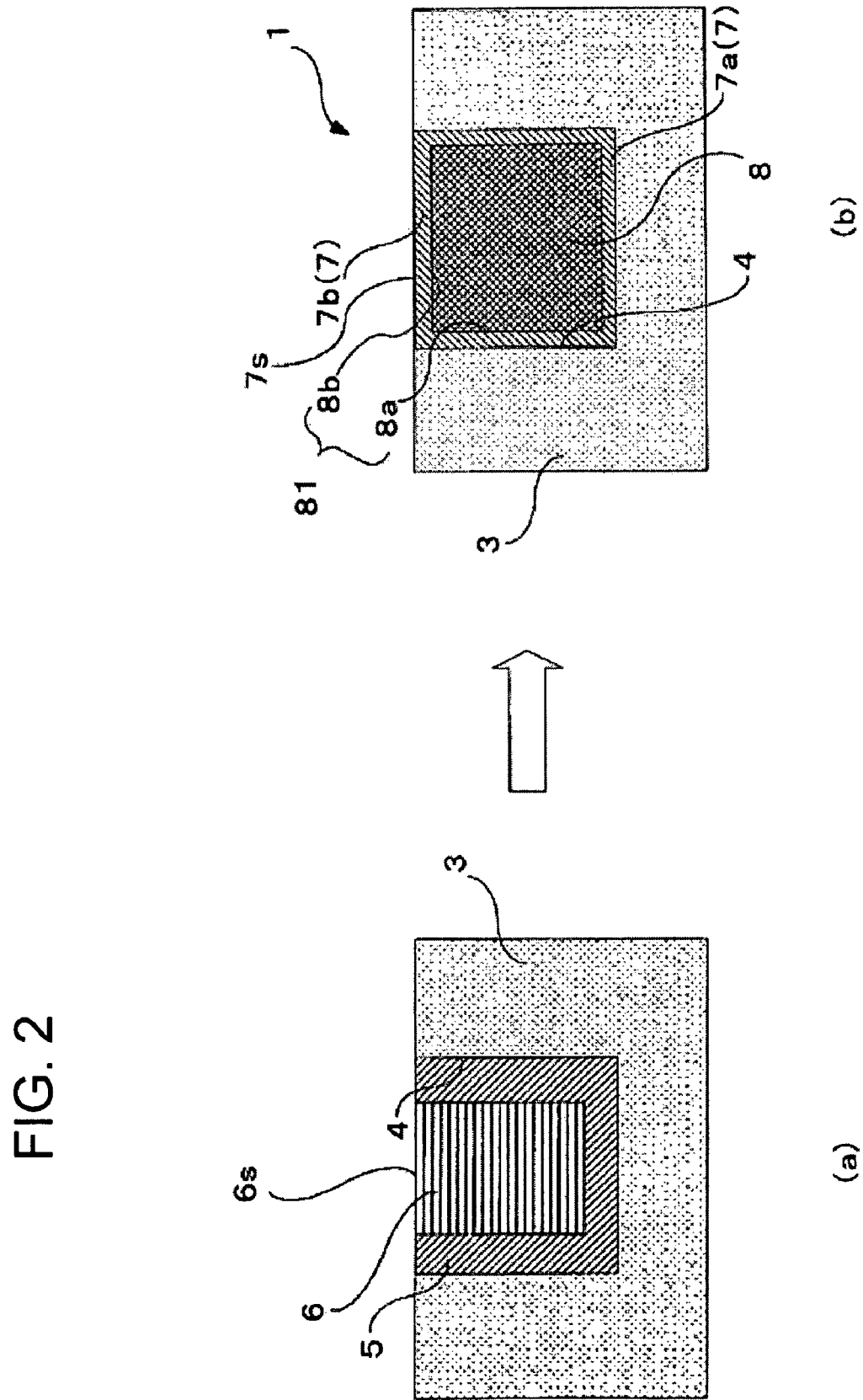
FIG. 2 illustrates a schematic diagram of a process for manufacturing of an embodiment of a copper interconnection structure.

Referring next to FIG. 2, a schematic diagram of a process for manufacturing of an embodiment of a copper interconnection structure 1 is shown. The first half of the manufacturing process is depicted in FIG. 2(a). As shown in this figure, the manufacturing process for forming the copper interconnection structure 1 begins first with providing an opening 4, with a groove shape, in the insulating layer 3. Then, a copper alloy layer 5 containing manganese is formed on an inner surface side of the opening 4. Subsequently, a buried copper 6 is formed over the copper alloy layer 5 so as to substantially filling the opening 4.

The latter half of the manufacturing process is depicted in FIG. 2(b). The manufacturing process continues with applying a heat treatment to the structure shown in FIG. 2(a). By applying this heat treatment under a predetermined condition, manganese in the copper alloy layer 5 is diffused toward the inner surface side of the opening 4 and an upper surface side 6s of the buried copper 6 so as to form the barrier layer 7 as well as the interconnection body 8. Thereby, an oxide layer containing manganese is formed on the inner surface side of the opening 4, facing the insulating layer 3, and the open surface 6s side of the buried copper 6, which is not facing the insulating layer 3. On the other hand, the interconnection body 8 is formed by unifying a part of the copper alloy layer 5 with copper from the buried copper 6 such that the interconnection body 8 is surrounded by the barrier layer 7 and the copper interconnection structure 1 is formed, as shown in FIG. 2(b). The predetermined condition in which the heat treatment is applied to the structure shown in FIG. 1(a) will be discussed further below in detail.

The barrier layer 7 is formed from the copper alloy layer 5 containing manganese. Manganese in the copper alloy layer 5 has a diffusion coefficient equal or greater than the self diffusion coefficient of copper. In addition, manganese as a main additive element of the copper alloy layer 5 is oxidized easily compared to copper. The main additive element is an element which is contained at the maximum concentration among the elements added to the copper alloy layer 5.

In this embodiment, the copper alloy layer 5 contains manganese as the main additive element, and subordinate elements other than manganese may also be added to the copper alloy layer 5. It is also preferable that each of the subordinate elements, contained in the copper alloy layer 5, has a diffusion coefficient equal or greater than the self diffusion coefficient of copper and be oxidized easily compared to copper. Examples of favorable subordinate elements, added to the copper alloy layer 5, may include Zinc (Zn), germanium (Ge), strontium (Sr), silver (Ag), cadmium (Cd), indium (In), tin (Sn), barium (Ba), praseodymium (Pr), and neodymium (Nd).

The copper alloy layer 5 is formed by a sputtering method using an alloy material of manganese and copper (Cu—Mn alloy) as a target. For example, in this embodiment, the copper alloy layer 5 is deposited on the insulating layer 3 by a high-frequency sputtering method using a Cu—Mn alloy target, which contains manganese in a concentration range of not less than 1.0 atom % and not more than 25.0 atom % in concentration. Other embodiments may use other deposition procedure for forming the copper alloy layer 5. Examples of other deposition procedure may include a physical vapor deposition procedure, such as ion plating method or laser ablation method, or chemical vapor deposition (CVD) procedure, such as an atomic layer deposition (ALD) method, or spin coat procedure.

The copper alloy layer 5 is deposited on a dense or porous surface of the electric insulating layer 3 (inner surface of the opening 4). In this embodiment, the dense or porous surface of the insulating layer 3 may contain silicon (Si), such as silicon carbide oxide (SiOC), silicon nitride oxide (SiNO), silicon fluoride oxide (SiFO), silicon dioxide ($SiO_2$) and the like. In some embodiments, the dense or porous electric insulating layer 3 is formed from an organic silicon compound, such as hydrogen silsesquioxane (HSQ) or methyl silsesquioxane (MSQ) (refer to "Semiconductor Device ($2^{nd}$ edition)—Physics and Technology" by S. M. Sze P346-347 above). In other embodiments, the dense or porous surface of the electric insulating layer 3 is formed from an organic carbide hydride, such as polyarylen. In yet other embodiments, the dense or porous surface of the insulating layer 3 is formed form a high permittivity metal oxide, such as tantalum oxide ($Ta_2O_5$: relative permittivity=25) or titanium oxide ($TiO_2$: relative permittivity=40) (refer to "Semiconductor Device ($2^{nd}$ edition)—Physics and Technology" by S. M. Sze P347 above), or hafnium oxide ($HfO_2$), zirconium oxide ($ZrO_2$) and the like.

In this embodiment, the electric insulating layer 3 may be configured from a single $SiO_2$ insulating layer. Alternatively, other embodiments may use multilayer structure for the electric insulating layer 3. The insulating layer 3 with multilayer structure may have a first insulating layer such as silicon oxide carbide (SiOC) and a second insulating layer, formed over the first insulating layer, made from different materials such as silicon nitride ($Si_3N_4$), or silicon carbide nitride (SiCN), or silicon carbide (SiC). Another example of the multilayer structure may include the first insulating layer made from a porous HSQ layer or MSQ layer having a plurality of pores with the average pore diameter of about 1 nm, and the second insulating layer formed from tantalum oxide ($Ta_2O_5$) which is formed from the oxidation of tantalum (Ta).

In what follows the predetermined condition in which the heat treatment is conducted will be discussed. The reason for heat treating the copper alloy layer 5 is to diffuse manganese toward a joint interface with the electric insulating layer 3 and/or toward the upper surface 6s form the buried copper 6. Thereby, the barrier layer 7, which in fact consists of an oxide layer containing manganese is formed in close proximity to the joint interface with the electric insulating layer 3 and to the upper surface 6s. The heat treatment for forming the barrier layer 7 is preferably applied at a temperature where the atomic diffusion becomes dominant by: (1) the electric field generated between the insulating layer 3 and copper alloy layer 5, and/or (2) the electric field generated in close proximity to the upper surface 6s of the buried copper 6. The second electric field is resulted from the oxygen (oxygen ion) containing in the applied atmosphere, which is absorbed on the upper surface 6s in a form of Mn ion ($Mn^{2+}$ or $Mn^{3+}$), in which the valence of manganese is divalent or trivalent.

Preferable temperature range for applying the heat treatment pertaining to the present invention is not less than 150° C. and not more than 450° C. When the temperature is above 450° C., the thermal diffusion rapidly and significantly occurs compared to the case of diffusion by electrical field. In a common heat treatment with a high temperature where the thermal diffusion becomes dominant, the diffusion of manganese in the copper alloy layer 5 toward the upper surface side 6s and the inner surface of the opening 4 is promoted. In this way, the thickness of the barrier layer 7 increases in proportion to a square root of heat treatment time ($\sqrt{t}$). A disadvantage of the above case is when the thermal diffusion of manganese is further progressed after the completion of the heat treatment. In this case, the thickness of the barrier layer 7, which increases in proportion to the square root of heat treatment time ($\sqrt{t}$), will increase further such that it will exceed a desired range and result in forming an unstable barrier layer 7.

Meanwhile, when the temperature is at or below 450° C., the atomic diffusion of manganese is dominated by electric field. In this case, the thickness of the barrier layer 7 slightly increases, which is proportional to the logarithmic values of heat treatment time ($\log(t)$). For this reason, even though the barrier layer 7 is exposed to a residual heat after the completion of the heat treatment, the thickness of the barrier layer 7 will not increase rapidly. Therefore, temperatures at or below 450° C. are more favorable for forming an extremely thin barrier layer 7 in the copper interconnection structure 1 with a narrow interconnection width, e.g., 32 nm or less.

In order to efficiently diffuse manganese in the copper alloy layer 5, it is preferable that the heat treatment to be applied in an atmosphere containing oxygen with a favorable partial pressure. The favorable partial pressure of oxygen is adjusted to be less than an atomic concentration of oxygen No (atom %) in the copper alloy layer 5. The atomic concentration of oxygen (No), which is in fact a dissolved concentration of oxygen, may be obtained according to the following formula:

$$N_o = N_{Mn} * D_o / D_{Mn}$$

where $N_{Mn}$ (atom %), Do (cm²/s), and $D_{Mn}$ (cm²/s) represent respectively an atomic concentration of manganese, a diffusion coefficient of oxygen, and a diffusion coefficient of manganese in the copper alloy layer 5. Thus, it is necessary to heat-treat the copper alloy layer 5 in the atmosphere containing oxygen with the favorable partial pressure, as described above. The atomic concentration of manganese ($N_{Mn}$) in the copper alloy layer 5 may be quantified, for example, by a common secondary ion mass spectrometry (SIMS) method, an electron probe micro analysis (EPMA) method, an Auger electron spectroscopy (AES) method and the like.

An example of calculating the favorable partial pressure of oxygen is given below. For an absolute heat treatment temperature T (K) and the universal gas constant R (R=8.3J/mol·K), the diffusion coefficient of manganese ($D_{Mn}$) may be given as follows:

$$D_{Mn} = 1.02 \exp(-200000/RT) \quad (1)$$

Further, the diffusion coefficient of oxygen (Do) may be given according to the following formula:

$$Do = 1.20 \times 10^{-2} \exp(-67000/RT) \quad (2)$$

Further, the solubility of oxygen ($N_{sol}$) in the copper alloy layer 5 is proportional to the oxygen partial pressure ($P_{O2}$) in the heat treatment atmosphere according to the following formula:

$$N_{sol} = 26 (P_{O2})^{1/2} \exp(-126000/RT) \quad (3)$$

Therefore, the oxygen partial pressure ($P_{O2}$) can be obtained by calculating the ratio value $Do/D_{Mn}$ using the formula (1) and formula (2), and substituting $N_{sol}$, which is obtained by multiplying the ratio value by $N_{Mn}$, in the formula (3). The favorable oxygen partial pressure pertaining to the present invention is the oxygen partial pressure less than the value calculated from the formula (3). This value at a temperature of about 350° C. is 1.0 Pascal (Pa). More specifically, the most favorable oxygen partial pressure is ranging from 0.0001 to 0.1 Pascal. Other embodiments may use some constituent atmosphere, such as vacuum or an inert gas, where the constituent atmosphere does not react with copper (Cu).

Examples of the inert gas atmosphere which does not react with Cu may include nitrogen (N), argon (Ar), helium (He), neon (Ne), argon (Ar), krypton (Kr), xenon (Xe) and the like. Among the above inert gas atmospheres, helium (He), neon (Ne), or argon (Ar) are preferable. In particular, argon (Ar) with large molecules, which is difficult to be taken into the copper alloy layer 5, is more preferable.

When the copper alloy layer 5 is heat treated in the atmosphere containing oxygen with the favorable partial pressure, the solubility of oxygen $N_{sol}$ exceeds the following value: $N_{Mn} * Do/D_{Mn}$, thereby a large amount of oxygen can be dissolved into the copper alloy layer 5, which poses a problem for forming the interconnection body 8 with a low resistivity. Further, an upper surface 7s of the second barrier layer 7(b), becomes rough and not flat, thereby causing an inconvenience in the passivation of the upper surface 7s.

Figure 3:
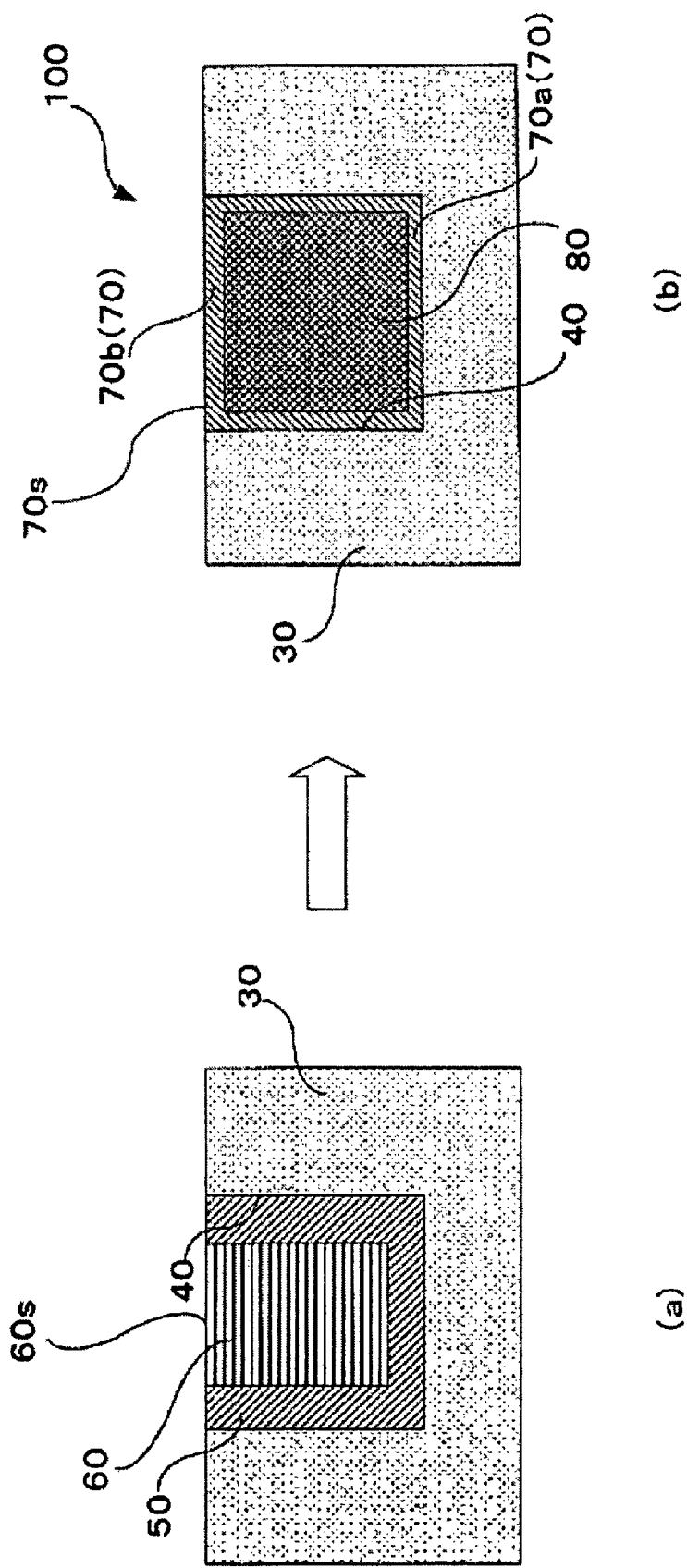
FIG. 3 illustrates a schematic diagram of an example of a process for manufacturing a copper interconnection structure.
Figure 4:
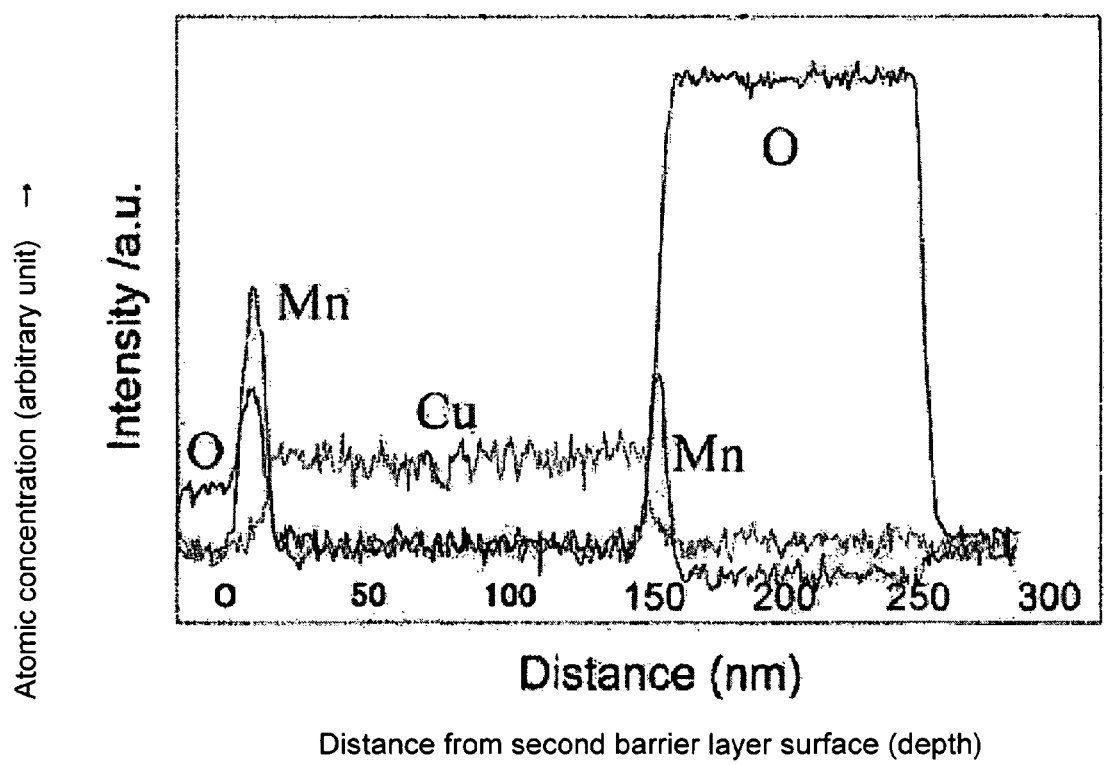
FIG. 4 illustrates a compositional view of the copper interconnection structure shown in FIG. 3.

With reference to FIGS. 3-4, a practical example of the first embodiment pertaining to the present invention will be explained in detail. By way of example, a copper interconnection structure 100 with a damascene structure is explained. In this embodiment, the copper interconnection structure 100 is provided with a barrier layer 70, which is formed from a copper alloy layer 50 containing manganese as an alloy element.

A schematic diagram of an example of a process for manufacturing a copper interconnection 100 is shown in FIG. 3. The first half of the manufacturing process is depicted in FIG. 3(a). As schematically shown in this figure, a Cu—Mn alloy layer 50 (copper alloy layer) is first deposited on the inner surface side of the interconnection groove (opening) 40, which is formed on the insulating layer 30. In this embodiment, the insulating layer 30 is made of silicon dioxide ($SiO_2$) layer with a thickness of 150 nm. The horizontal width of the interconnection groove, or opening 40, is made to be about 50 nm. The Cu—Mn alloy layer 50 is formed by simultaneously sputtering a target made of high-purity Cu and a target made of high-purity Mn in a common high frequency sputtering device. The atomic concentration of Mn in the Cu—Mn alloy layer 50 is quantified to be about 4 atom % by electron energy-loss spectroscopy (EELS) method. The thickness of Cu—Mn alloy layer 50 is about 30 nm.

Next, copper is plated on the surface of the Cu—Mn alloy layer 50 by an electrolytic plating method using the Cu—Mn alloy layer 50 above as a seed layer. Thereby, a buried copper 60 is formed such that the interconnection groove 40 is substantially filled. Thereby, a structure body consisting of the Cu—Mn alloy layer 50 and the buried copper 60 in the interconnection groove 40 of the insulating layer 30 is formed.

Thereafter, the structure body of FIG. 3(a), is heat treated for a time period about 30 minutes at a temperature of about 350° C. The heat treatment is applied in an argon (Ar) atmosphere (oxygen volume concentration is not more than 0.01 vol.ppm (oxygen partial pressure 0.001 Pa)) at a pressure of 1 atmosphere (0.1 mega-pascal (MPa) of total pressure).

The oxygen volume concentration of 0.01 vol.ppm is determined as follows: the diffusion coefficient of Mn ($D_{Mn}$) at a temperature of about 350° C. is calculated from formula (1): $D_{Mn} = 1.7 \times 10^{-17}$ cm² s⁻¹. Then, the diffusion coefficient of oxygen (Do) at temperature of about 350° C. is calculated from formula (2): $Do = 4.1 \times 10^{-8}$ cm² s⁻¹. Furthermore, since the atomic concentration of Mn ($N_{Mn}$) in the Cu—Mn alloy layer 50 is $4.0 \times 10^{-2}$, the solubility of oxygen (No) is calculated from formula (3) above: $No = 1.7 \times 10^{-11}$. Therefore, the oxygen partial pressure of the atmosphere is made to be $10^{-6}$ atmosphere pressure (0.1 Pa), which gives the solubility of oxygen not more than $1.7 \times 10^{-11}$. That is, it is equal to 0.01 vol.ppm which sufficiently falls below 1 vol.ppm, as an oxygen concentration when the total pressure is atmosphere pressure.

By this heat treatment, manganese contained in the Cu—Mn alloy layer 50 is diffused toward the interface with the insulating layer ($SiO_2$) 30 and the upper surface 60s of the buried copper 60, which is open to the heat treatment atmosphere. Thereby the first barrier layer 70a composed of manganese series oxide is formed between the insulating layer 30 ($SiO_2$) and the interconnection body 80, as shown in FIG. 3(b). Further, the second barrier layer 70b composed of Mn bearing oxide is formed in contact with the interconnection body 80 in the area proximity to the opening surface 60s of the copper buried layer 60. The thickness of the first barrier layer 70a is about 5 nm while the thickness of the second barrier layer 70b is about 7 nm. Furthermore, the interconnection body 80 is formed by unifying a part of the copper alloy layer 50 with the copper from the buried copper 60 such that the interconnection body 80 is surrounded by the barrier layer 70. In this way, the copper interconnection 100 with damascene structure is formed.

After applying the heat treatment with the predetermined condition as described above, the second barrier layer 70b, the interconnection body 80, the first barrier layer 70a and the insulating layer 30 are examined from the surface 70s of the second barrier layer 70b in a vertical direction (depth direction) with a common electron energy-loss spectroscopy (EELS) method. Thereby, the concentration distribution of the elements in the above-mentioned layers is measured.

FIG. 4 illustrates a compositional view of the copper interconnection structure 100. In this figure, the distribution of atomic concentration for manganese (Mn), copper (Cu), and oxygen (O) is shown, respectively, in the second barrier layer 70b, the interconnection body 80, the first barrier layer 70a, and the interlayer insulating layer 30. The vertical axis indicates the atomic concentration and the horizontal axis indicates the distance (depth) from the surface 70s of the second barrier layer 70b. As shown in FIG. 4, manganese (Mn) is locally accumulated inside of the first barrier layer 70a and the second barrier layer 70b. The atomic concentration of manganese is distributed in a normal distribution curve such that the maximum concentration is located at the center of each of the barrier layers 70a and 70b. In addition, the atomic concentration of manganese is distributed symmetrically centering around the position where the atomic concentration of manganese is maximized.

The maximum atomic concentration of manganese in the second barrier layer 70b is greater than the atomic concentration of manganese in the first barrier layer 70a. This maximum value in the second barrier layer 70b is about 1.45 times higher than the maximum value in the first barrier layer 70a.

Further, in the second barrier layer 70b, an atomic concentration of oxygen (O) is maximized in close proximity to the position where the atomic concentration of manganese is maximized. Furthermore, oxygen in the second barrier layer 70b is symmetrically distributed centering around the position where the atomic concentration of oxygen is maximized in the thickness direction. That is, similar to manganese atom, the oxygen atom is showing a normal distribution curve, which is symmetrical at the center of the second barrier layer 70b.

Since the heat treatment is performed in an atmosphere containing oxygen at the favorable partial pressure as described above, the open surface 60s of the copper buried layer 60 (surface 70s of the second barrier layer 70b) is a flat surface without being rough. Further, the electric resistivity of the interconnection body 80 after the heat treatment is about 1.9 μΩ·cm, which is virtually equal to pure copper (the electric resistivity for pure Cu bulk is 1.7 μΩ·cm). Therefore, it becomes clear that embodiment of the present invention may provide copper interconnections with low resistivity (close to a pure Cu bulk material), which is favorable for manufacturing various electronic devices.

Next, a second embodiment of the present invention in terms of copper interconnection structure and its manufacturing process will be explained with reference to FIGS. 5-6.

Figure 5:
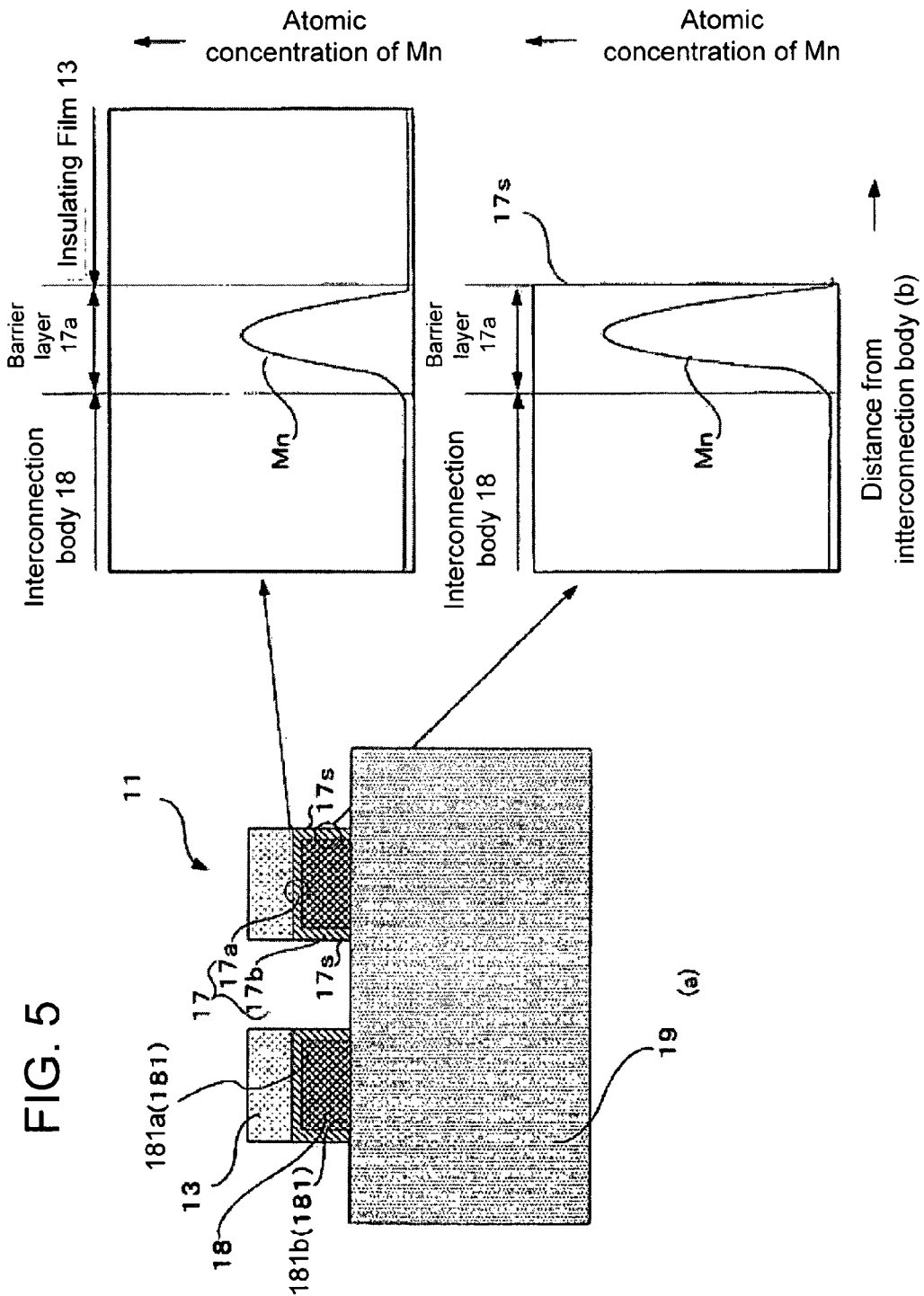
FIG. 5 illustrates a cross-sectional view of an alternative embodiment of a copper interconnection structure and a compositional view of its barrier layers.

Referring next to FIG. 5, an alternative embodiment, the second embodiment, of a copper interconnection structure 11 with a compositional view of its barrier layer 17 is shown. A cross-sectional view of the copper interconnection structure 11 is illustrated in FIG. 5(a). As shown in this figure, the copper interconnection 11 of the present invention may include an interconnection body 18, an electric insulating layer 13 and a barrier layer 17. The interconnection body 18 is formed between a main body 19 and the electric insulating layer 13. The interconnection body 18 is made of copper and its outer surface 181 is surrounded by the barrier layer 17. The barrier layer 17 consists of two portions: 1) a first barrier layer 17a and 2) a second barrier layer 17b. Accordingly, the outer surface 181 of the interconnection body 18 also consists of two portions: 1) a first outer surface 181a and 2) a second outer surface 181b. Thus, the first barrier layer 17a is formed between the electric insulating layer 13 and the first outer surface 181a, which is facing the electric insulating layer 13. The first outer surface 181a is positioned on the top surface of the interconnection body 18. Further, the second barrier layer 17b is formed on the second outer surface 181b in proximity to open surface sides of the interconnection body 18, which is not facing the electric insulating layer 13.

Each of the first and the second barrier layers 17a and 17b is composed of an oxide layer having a position where the atomic concentration of manganese is maximized in their thickness direction.

In this way, the distribution of atomic concentration of manganese in the barrier layer 17 of the second embodiment is similar to the distribution of atomic concentration of manganese in the barrier layer 7 or 70 of the first embodiment of the present invention. Therefore, manganese is surely converted into an oxide layer with electrical insulating properties in the first and the second barrier layers 17a and 17b. By these barrier layers, the atomic diffusion of copper forming the interconnection body 18 into the electric insulating layer 13, and the atomic diffusion of atoms forming the insulating layer 13, such as silicon, into the interconnection body 18 may be surely prevented. Therefore, it is possible to provide an interconnection body with a barrier layer, which is superior in barrier properties against the atomic diffusion and also superior in conductivity. Furthermore, it is also possible to provide a copper interconnection body with a low electric resistivity and superior conductivity.

In the second embodiment of the present invention, similar to the first embodiment, the second barrier layer 17b is formed in a way that the atomic concentration of oxygen is maximized in close proximity to the position where the atomic concentration of manganese is maximized. Further, the maximum atomic concentration of manganese in the second barrier layer 17b is greater than the atomic concentration of manganese in the first barrier layer 17a. Since the second barrier layer 17b is formed on the open surface sides of the interconnection body 18, which are exposed to the atmosphere containing oxygen at the time of forming the barrier layer 17, it becomes possible to surely prevent the oxygen in the atmosphere from intruding into the interconnection body 18. This prevention may be achieved by configuring the second barrier layer 17b as described above. Therefore, it is possible to further improve the copper interconnection structure 11 by providing an interconnection body 18 with a lower resistivity and higher conductivity.

Furthermore, in the second embodiment of the present invention, similar to the first embodiment, manganese in the second barrier layer 17b is symmetrically distributed centering the position where the atomic concentration of manganese is maximized in the thickness direction. In addition, oxygen in the second barrier layer 17b is also symmetrically distributed centering the position where the atomic concentration of oxygen is maximized in the thickness direction. Therefore, it is equally possible to prevent impurities from intruding into the interconnection body 18 from the open surface sides 17s of the second barrier layer 17b. Additionally, it is also possible to prevent the bidirectional movement of copper from the interconnection body 18 into the open surface sides 17s of the second barrier layer 17b due to the self diffusion of copper. Thereby, it is possible to obtain a barrier layer with superior barrier properties. In this way, it is also possible to further surely provide a copper interconnection structure 11 with an interconnection body 18 featuring a low electric resistivity and higher conductivity.

Figure 6:
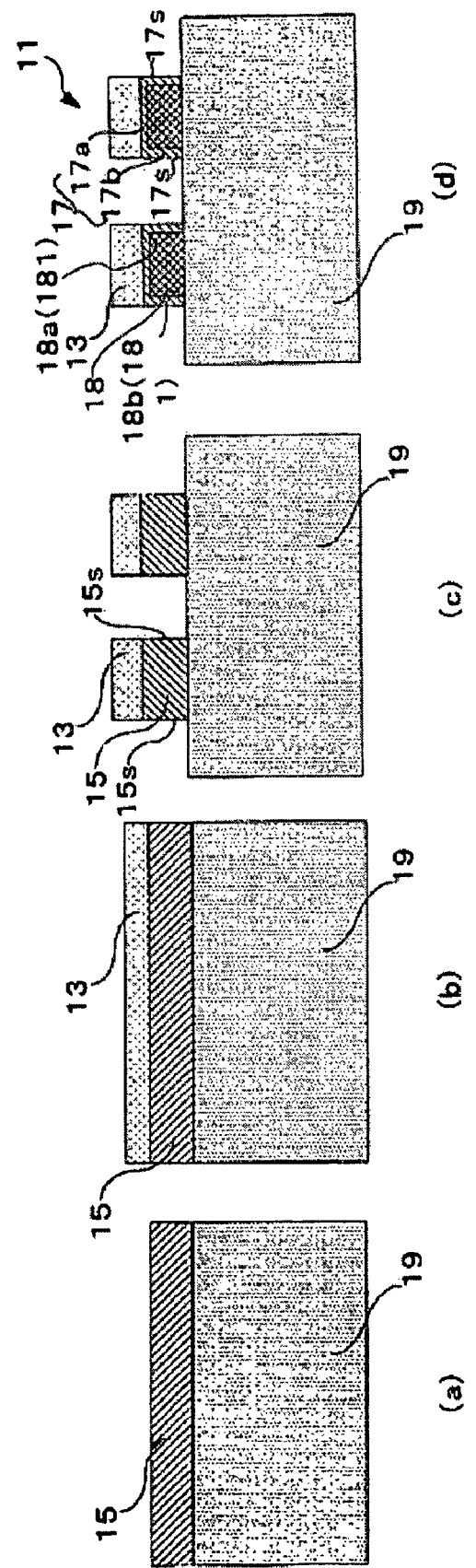
FIG. 6 illustrates a schematic diagram of a process for manufacturing of an alternative embodiment of a copper interconnection structure.

FIG. 6 illustrates a schematic diagram of a process for manufacturing of the second embodiment of a copper interconnection structure. The first step of the manufacturing process is shown in FIG. 6(a). As shown in this figure, the manufacturing process for forming the copper interconnection structure 11 begins first with depositing a copper alloy layer 15, made of copper-manganese (Cu—Mn) alloy, over a top surface of the main body 19. The main body 19 may include materials such as silicate glass with insulating properties. In the next step of the manufacturing process (FIG. 6(b)), the upper surface of the copper alloy layer 15 is covered with an electric insulating layer 13. FIG. 6(c) illustrates the third step of the manufacturing process. In this step, parts of the copper alloy layer 15 and the insulating layer 13 are removed using some photolithography process and the like. This removing step is performed in a way that an insulating portion 13 stacked on a copper alloy portion 15 is formed over the main body 19, leaving only areas where the copper interconnections will be formed. In this embodiment, the copper alloy portion 15 may include a top surface side facing the insulating portion 13, a bottom surface side facing the main body 19, and two open surface sides 15s directly exposed to a surrounding atmosphere. The last step of the manufacturing process is shown in FIG. 6(d). In this step, the structure body of FIG. 6(c) is heat treated under the same predetermined conditions as those described in the first embodiment. By applying this heat treatment, manganese in the copper alloy portion 15 is diffused toward the electric insulating portion 13 and two open surface sides 15s so as to form the barrier layer 17 as well as the interconnection body 18. Thereby, an oxide layer containing manganese is formed on the top surface side of the copper alloy portion 15, facing the electric insulating portion 13, and the two open surface sides 15s of the copper alloy portion 15, which is not facing the insulating portion 13. On the other hand, the interconnection body 18 is formed by transforming a part of copper alloy portion 15 into a layer essentially made of copper and surrounded by the barrier layer 17 and the main body 19. In this way, the copper interconnection structure 11 is formed as shown in FIG. 6(d). In the second embodiment, similar to the first embodiment, the electric resistivity of the interconnection body 18 is 1.9 $\mu\Omega\cdot cm$, which is virtually equal to the resistivity of pure copper (the electric resistivity of pure Cu bulk is 1.70 $\mu\Omega\cdot cm$). Therefore, the embodiments of the present invention may provide copper interconnections with low resistivity (close to a pure Cu bulk material), favorable for manufacturing various electronic devices.

In both copper interconnection structures 1 and 11, pertaining respectively to the first and second embodiment of the present invention, the outer surfaces 81 and 181 of the interconnection bodies 8 (80) and 18 are surrounded by the barrier layers 7 (70) and 17. Therefore, bidirectional diffusions such as the atomic diffusion of the component materials or impurities of the insulating layers 3 (30) and 13 into the copper interconnection bodies 8 (80) and 18, and the diffusion of copper from the copper interconnection bodies 8 (80) and 18 into the insulating layers 3 (30) and 13, may be prevented even if an insulating layer is further deposited on the top surface of the copper interconnection 1 or on the open surface sides of the copper interconnection 11. Consequently, it is possible to manufacture semiconductor devices featuring a plurality of copper interconnections having a low electric resistivity. Examples of such a semiconductor devices may include low-power-consumption liquid crystal display (LCD) devices, flat display panels (FDP) devices, organic electroluminescence (EL) devices, inorganic EL devices and the like.

Moreover, in both copper interconnection structures 1 and 11, the barrier layers 7 (70) and 17 are composed of an oxide layer containing manganese having a position where the atomic concentration of manganese is maximized in the thickness direction of the barrier layers 7 (70) and 17. Furthermore, in the second barrier layers 7b (70b) and 17b, the atomic concentration of oxygen is also maximized in close proximity to the position where the atomic concentration of manganese is maximized. Therefore, it is possible to provide semiconductor devices with a high electro-migration resistance while featuring simultaneously a low interconnection resistance. Examples of those semiconductor devices may include large-scale integrated (LSI) systems which require a nano interconnection of the interconnection width of 32 nm or less. Because of their low interconnection resistance, the RC time constant, at the time of communicating an electrical signal, is low. Thereby display devices, such as a large-size LCD with low RC delay, may be structured. Furthermore, semiconductor devices, such as silicon (Si) LSI which requires a damascene type fine interconnection, may also be favorably structured.

Furthermore, in both embodiments, the outer surfaces 81 and 181 of the interconnection bodies 8(80) and 18 are covered by the second barrier layers 7b (70b) and 17b. Thus, the second barrier layers 7b (70b) and 17b may be formed without losing the smoothness and flatness of the outer surfaces 81 and 181 of the interconnection bodies 8 (80) and 18. Therefore, it is possible to manufacture semiconductor devices, such as silicon large-scale (LSI) systems, featuring multiple tandem copper interconnection structures.

What is claimed is:
1. A copper interconnection structure comprising:
an insulating layer;
an interconnection body including copper; and
a barrier layer surrounding the interconnection body, wherein the barrier layer comprises:
a first barrier layer formed between a first portion of said interconnection body and the insulating layer, wherein the first portion of said interconnection body is part of the interconnection body that faces the insulating layer, and
a second barrier layer formed on a second portion of said interconnection body, wherein the second portion of said interconnection body is part of the interconnection body not facing the insulating layer, and
wherein:
each of said first and said second barrier layers is formed of an oxide layer including manganese, and each of said first and said second barrier layers has a position where the atomic concentration of manganese is maximized in their thickness direction of said first and said second barrier layers, wherein the maximum atomic concentration of manganese in the second barrier layer is greater than the atomic concentration of manganese in the first barrier layer.

2. The copper interconnection structure of claim 1, wherein the second barrier layer comprises an atomic concentration of oxygen maximized in close proximity to the position where the atomic concentration of manganese is maximized.

3. The copper interconnection structure of claim 2, wherein oxygen in the second barrier layer is symmetrically distributed centering around the position where the atomic concentration of oxygen is maximized in the thickness direction.

4. The copper interconnection structure of claim 1, wherein manganese in the second barrier layer is symmetrically distributed centering around the position where the atomic concentration of manganese is maximized in the thickness direction.

5. A semiconductor device having a copper interconnection structure as a circuit interconnection, wherein said copper interconnection structure is the copper interconnection structure recited in claim 1.

* * * * *